(12) United States Patent
Hsueh et al.

(10) Patent No.: US 12,476,166 B2
(45) Date of Patent: Nov. 18, 2025

(54) INVERTED TRAPEZOIDAL HEAT DISSIPATING SOLDER STRUCTURE AND METHOD OF MAKING THE SAME

(71) Applicant: TAIWAN SEMICONDUCTOR MANUFACTURING COMPANY, LTD., Hsinchu (TW)

(72) Inventors: Chang-Jung Hsueh, Taipei (TW); Yen Wei Chang, Taipei (TW); Cheng-Nan Lin, Hsinchu (TW); Wei-Hung Lin, Xinfeng Township (TW); Ming-Da Cheng, Taoyuan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 556 days.

(21) Appl. No.: 17/829,243

(22) Filed: May 31, 2022

(65) Prior Publication Data

US 2023/0386964 A1   Nov. 30, 2023

(51) Int. Cl.
*H01L 21/02* (2006.01)
*H01L 21/285* (2006.01)
*H01L 23/373* (2006.01)

(52) U.S. Cl.
CPC .... *H01L 23/3736* (2013.01); *H01L 21/02052* (2013.01); *H01L 21/2855* (2013.01)

(58) Field of Classification Search
CPC .......... H01L 23/3736; H01L 21/02052; H01L 21/2855; H01L 23/49816; H01L 23/42; H01L 23/3675; H01L 23/5385

USPC .......................................................... 257/704
See application file for complete search history.

(56) References Cited

U.S. PATENT DOCUMENTS

| | | | | |
|---|---|---|---|---|
| 5,587,882 A | * | 12/1996 | Patel | H01L 25/0655 257/713 |
| 5,956,576 A | * | 9/1999 | Toy | H01L 23/10 438/122 |
| 5,982,038 A | * | 11/1999 | Toy | H01L 23/10 257/772 |
| 6,020,637 A | * | 2/2000 | Karnezos | H01L 23/36 257/E23.101 |
| 6,218,730 B1 | * | 4/2001 | Toy | H01L 23/42 257/713 |
| 7,183,641 B2 | * | 2/2007 | Renavikar | H01L 23/42 257/713 |
| 7,239,517 B2 | * | 7/2007 | Fitzgerald | H01L 23/42 257/E21.503 |

(Continued)

*Primary Examiner* — Vu A Vu
(74) *Attorney, Agent, or Firm* — STUDEBAKER BRACKETT PLLC

(57) ABSTRACT

In a method of forming a heat dissipating structure for a semiconductor chip, a soldering material is disposed on a top surface of the semiconductor chip. A first region of metal plating is formed on a surface of a lid. The first region has a first width and a first length. The first width is larger than a second width of the top surface of the semiconductor chip and the first length is larger than a second length of the top surface of the semiconductor chip. The lid is placed over the semiconductor chip so that the first region of metal plating of the lid is disposed over the soldering material to bond the lid to the semiconductor chip by a soldering material layer having an inverted trapezoidal shape between the lid and the top surface of the semiconductor chip.

20 Claims, 11 Drawing Sheets

(56) References Cited

U.S. PATENT DOCUMENTS

| | | | | |
|---|---|---|---|---|
| 7,268,428 B2* | 9/2007 | Edwards | ............... | H01L 23/10 |
| | | | | 257/E23.087 |
| 7,271,479 B2* | 9/2007 | Zhao | ............... | H01L 24/73 |
| | | | | 257/E23.101 |
| 7,288,438 B2* | 10/2007 | Lu | ............... | H01L 21/4871 |
| | | | | 257/E23.101 |
| 7,813,133 B2* | 10/2010 | Iijima | ............... | H01L 23/3675 |
| | | | | 428/210 |
| 7,892,883 B2* | 2/2011 | Kostiew | ............... | H01L 23/42 |
| | | | | 257/E21.503 |
| 9,607,923 B2* | 3/2017 | Hung | ............... | H01L 23/3736 |
| 2020/0137864 A1 | 4/2020 | Su et al. | | |

\* cited by examiner

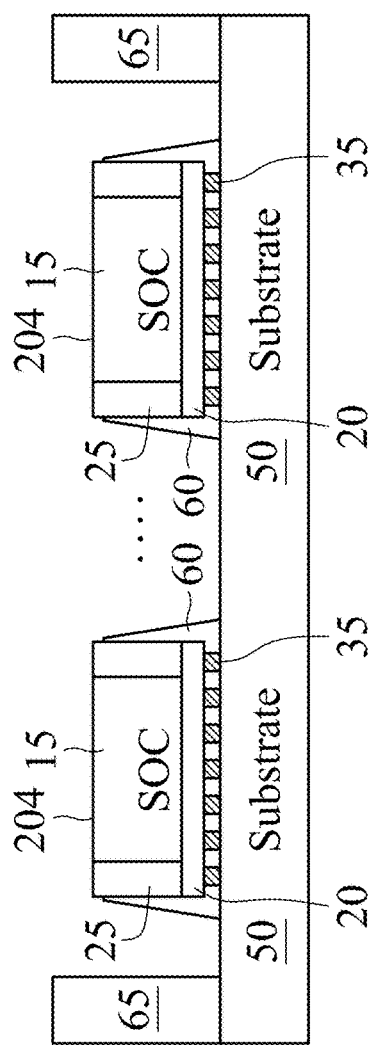
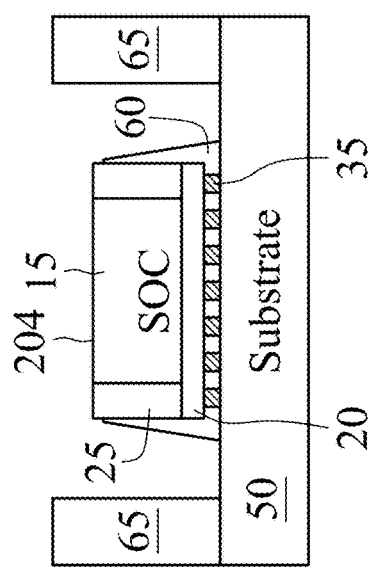
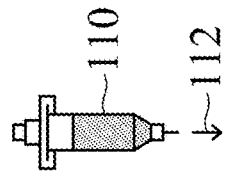
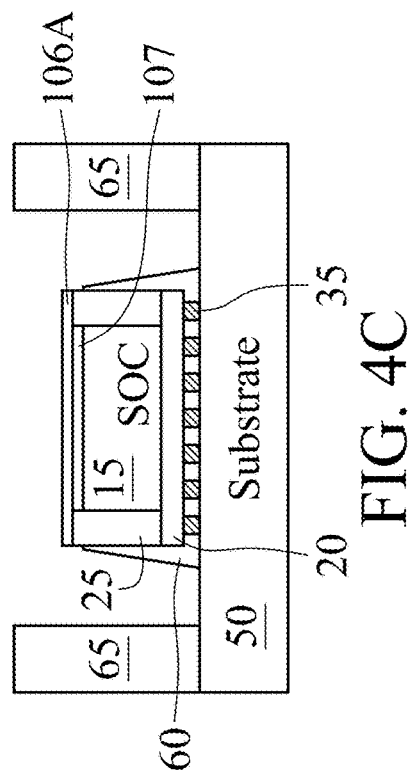

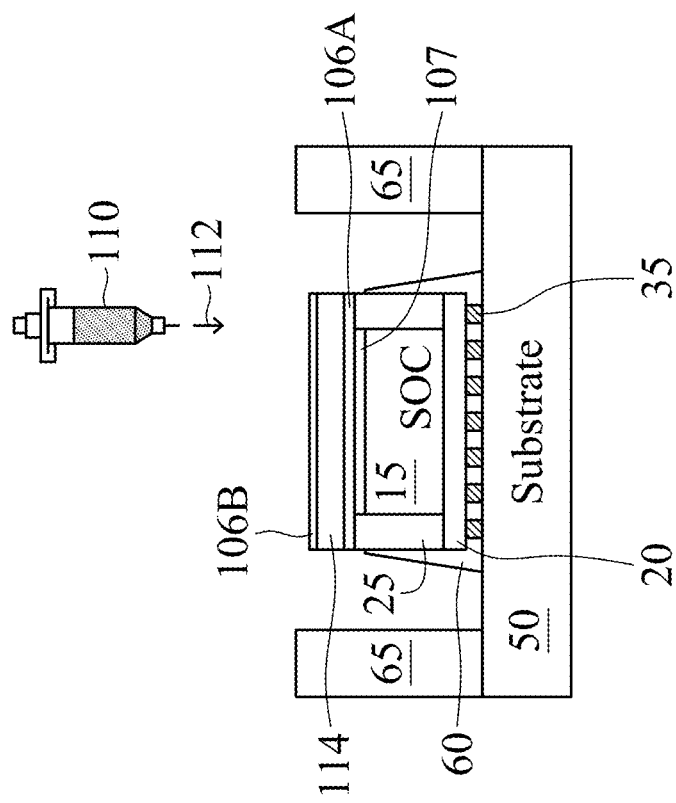
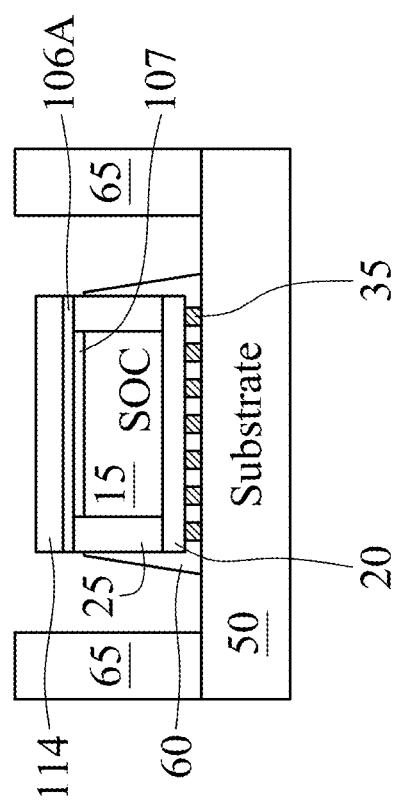
FIG. 4D
FIG. 4E

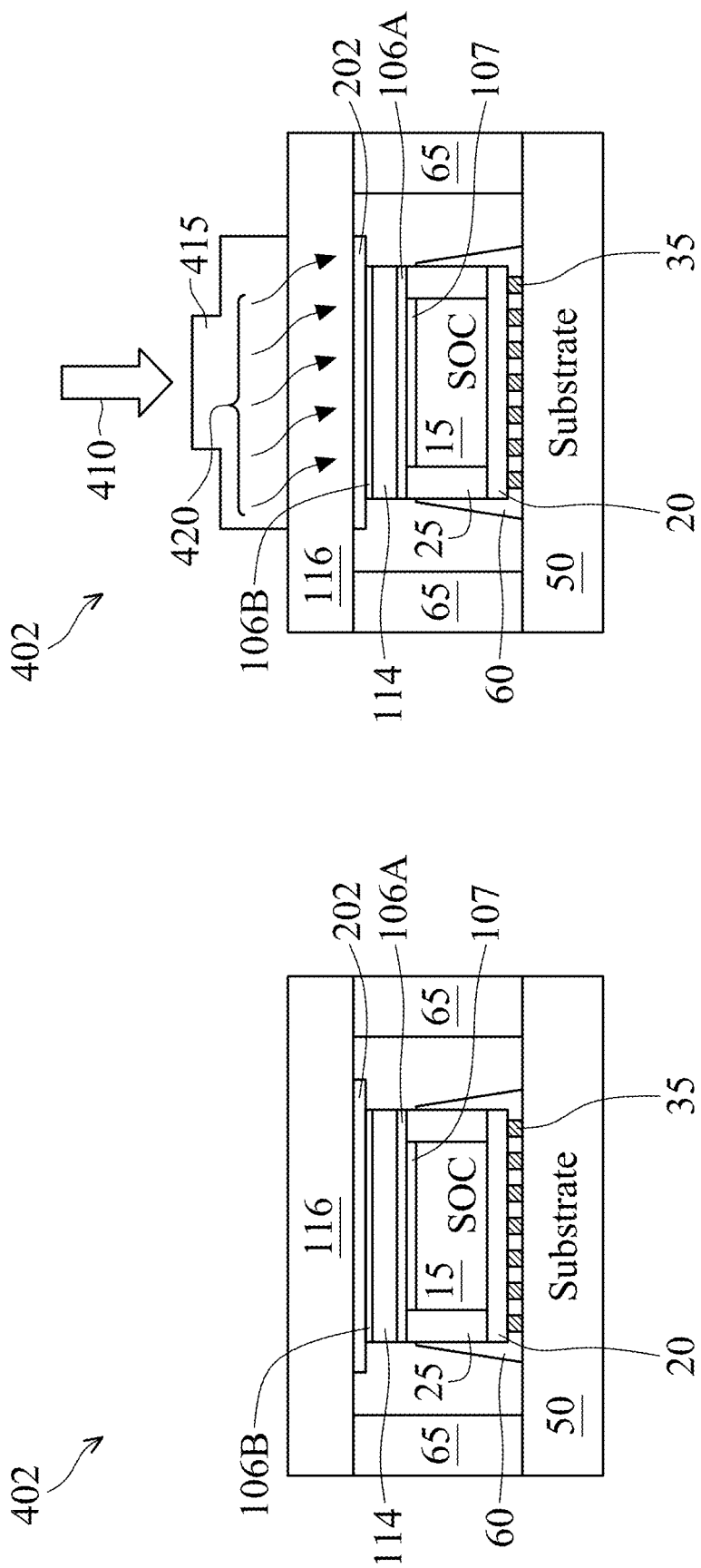

INVERTED TRAPEZOIDAL HEAT DISSIPATING SOLDER STRUCTURE AND METHOD OF MAKING THE SAME

BACKGROUND

Thermal dissipation in an advanced package is becoming more and more challenging as the power consumption exceeds 500 W, especially in high performance and CPU intensive applications. Using thermal interface material (TIM) between a chip and a lid of the package enhances thermal dissipation. It is highly desirable to increase the thermal dissipation between the chip and the lid.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 4A, 4B, 4C, 4D, 4E, 4F, 4G, 4H, and 4I show a process of making two or more inverted trapezoidal heat dissipating solder structures according to an embodiment of the present disclosure.

DETAILED DESCRIPTION

Figure 1C:
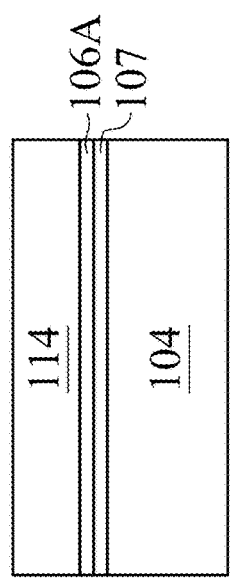
FIGS. 1A, 1B, 1C, 1D, 1E, and 1F show a process of making an inverted trapezoidal heat dissipating solder structure over a chip according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

Dissipating the heat generated in a semiconductor chip is challenging factor for chips that use high power and generate heat in excess of few hundred watts, e.g., in excess of 500 watts. The heat generated in a chip is generally removed by a heat sink and/or a fan mounted on a lid of the package that is attached on a top surface of the chip. It is generally required that the heat generated in the chip be dissipated from the top surface of the chip to the lid, e.g., the heat conducting lid. In some embodiments, a thermal interface material (TIM) is used between the top surface of the chip and the lid to efficiently conduct heat from the top surface of the chip to the lid.

In the present disclosure, a novel structure of the semiconductor package using a TIM to more effectively dissipate the heat generated in the semiconductor chip is used. In some embodiments, the TIM is constructed as a layer of an inverted trapezoidal shape such that the smaller base of the inverted trapezoidal shape TIM layer is in contact with the top surface of the chip and covers the chip. The larger base of the inverted trapezoidal shape of the TIM layer is in contact with the lid. Thus, the heat dissipated in the chip is transferred from an entire area of the top surface of the chip, via the TIM to a larger area on the lid, having the size of the larger base of the inverted trapezoidal shape.

In some embodiments, a first layer of a flux material is disposed over the top surface of the chip and a second layer of the flux material is disposed over the TIM layer. In some embodiments, heat, pressure, or a combination thereof is transferred through the lid to the TIM layer and the first and second layers of the flux material are used to respectively bond the top surface of the chip and the lid to the TIM layer. In some embodiments, transferring the heat, pressure, or the combination thereof causes the first and second flux layers evaporate after cleaning a top surface of the chip and a surface of the lid.

In some embodiments, a silver or gold plating is disposed on the lid and then the surface of the lid having the silver or gold plating is placed over the TIM material to be processed by heat and/or pressure. In some embodiments, the size of the silver or gold plating is larger than the size of the top surface of the chip. Therefore, after transferring the heat and/or pressure, the TIM layer in contact with the lid takes the size of the silver or gold plating and causes the TIM layer to have the inverted trapezoidal shape. In some embodiments, gold, titanium, or nickel is sputtered over the top surface of the chip. The silver or gold plating of the lid and the sputtered titanium, gold, or nickel on the top surface of the chip cause better bonding and better heat transfer properties between the top surface of the chip and the lid through the TIM layer. In some embodiments, two or more chips, e.g., semiconductor chips, are placed close to each other and are processed concurrently.

Figure 1B:
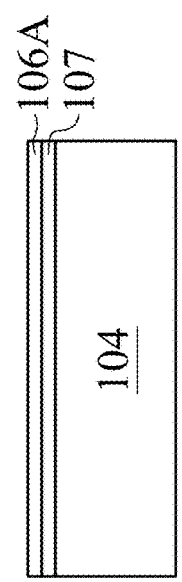
Figure 1A:
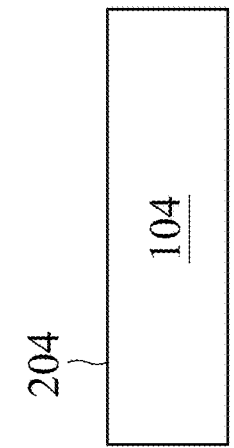
Figure 1E:
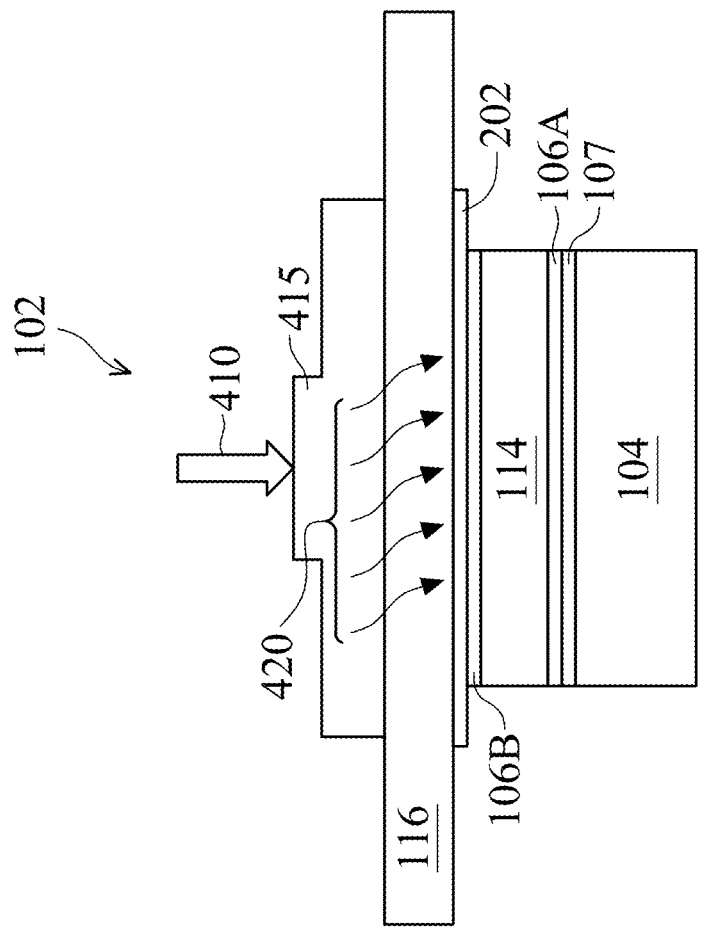
Figure 1D:
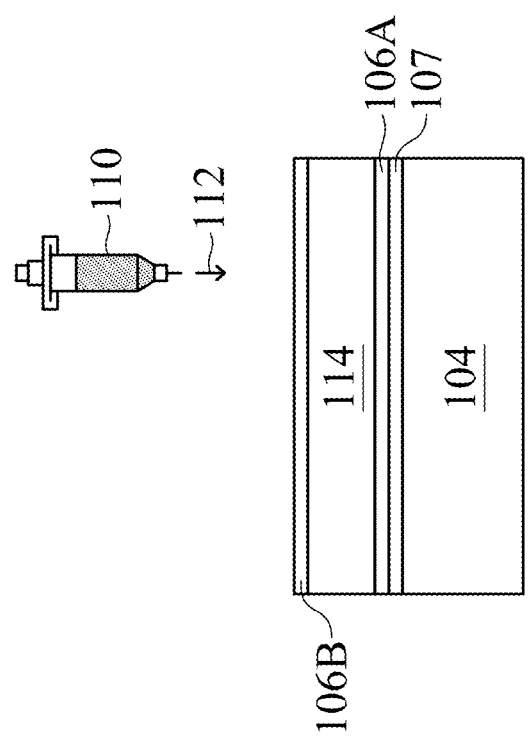

FIGS. 1A, 1B, 1C, 1D, 1E, and 1F show a process of making an inverted trapezoidal heat dissipating solder structure over a chip according to an embodiment of the present disclosure. FIG. 1A shows a chip 104 to be packaged, e.g., a semiconductor chip, having a top surface 204. In some embodiments, the chip 104 has a back side metal structure. In FIG. 1B, a metal layer 107 of titanium, gold, or nickel is deposited, e.g., sputtered, on the top surface 204 of the chip 104. In some embodiments, the metal layer 107 includes one or more of AuIn2, AuIn and InNiAu. FIG. 1B shows a dispensing device 110 that includes flux material 112. As shown, the flux material 112 is dispensed over the top surface 204 of the chip 104 to produce a first flux material layer 106A that is disposed over the chip 104, e.g., over the metal layer 107. FIG. 1C shows that a soldering material layer 114 is disposed over the first flux material layer 106A. In some embodiments, the soldering material, e.g., the TIM, is in a form of a thin layer, e.g., a foil, that is spread over the first flux material layer 106A. In some embodiments, the flux material is an organic material such as citric, lactic, or stearic acid. The acids are then combined with organic solvents such as alcohol or isopropyl. In some embodiments, the flux material is in a form of liquid or paste. In some embodiments, the soldering material includes indium (In) or an alloy of indium with silver and/or copper, e.g., InAg, InCu, or InAgCu. In other embodiments, the soldering material includes a tin-containing alloy, such as PbSn, AgSn, SnAgCu, CuSnNi, AgCuSbSn, AuSn, or CuSn. FIG. 1D shows the dispensing device 110 that is dispensing the flux material 112 over the soldering material layer 114 to produce a second flux material layer 106B. FIG. 1E shows that a lid 116 disposed over the second flux material layer 106B. In addition, a heat/pressure application device 415 is placed over the lid 116 and heat and/or pressure 410 is applied through the heat/pressure application device 415 to the lid 116.

In some embodiments, the lid 116 includes a heat conducting metal, e.g., steel. In some embodiments, heat energy 420 in a temperature range that a temperature of the soldering material layer 114 between about 150 degrees Celsius and 400 degrees Celsius and a pressure between about 50 kPa and 20 MPa is applied to the lid 116. In some embodiments, the first flux material layer 106A and the second flux material layer 106B respectively remove impurities and oxides from the top surface 204 of the chip 104 and from the surface of the lid 116. In addition, the first flux material layer 106A and the second flux material layer 106B prevent further oxidation and respectively facilitate bonding of the soldering material layer 114 with the top surface 204 of the chip 104 and with the surface of the lid 116. In some embodiments, the higher temperatures in the above range, when applied to the lid 116, the first flux material layer 106A and the second flux material layer 106B effectively evaporate and, thus, the soldering material layer 114 bond with the top surface 204 of the chip 104 and with the surface of the lid 116. In some embodiment, the heat energy 420 is increased such that the soldering material layer 114 receives a temperature in the higher range of the above limit of 150 degrees Celsius to 400 degrees Celsius such that the first flux material layer 106A and the second flux material layer 106B effectively evaporate after respectively cleaning the surfaces of the metal layer 107 and the metal plating 202.

Figure 1F:
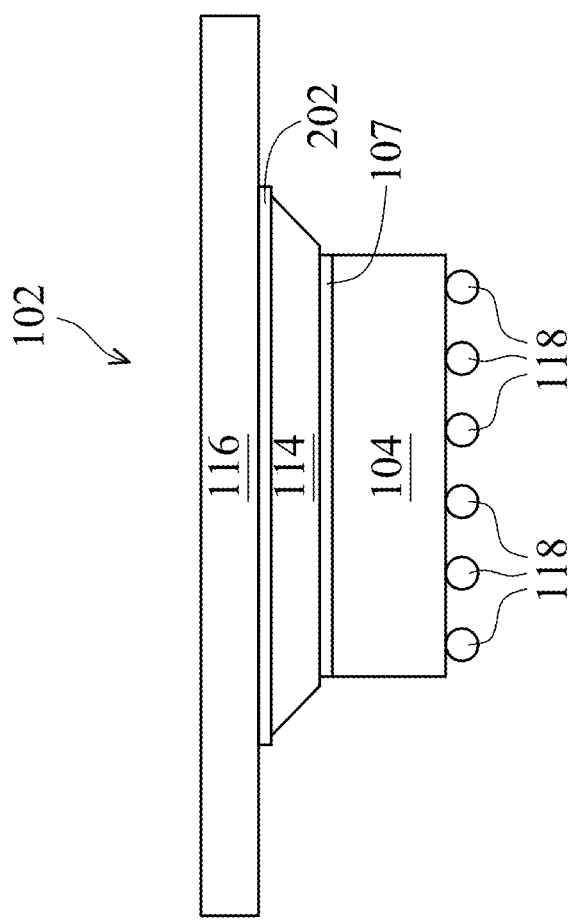
Figure 3:
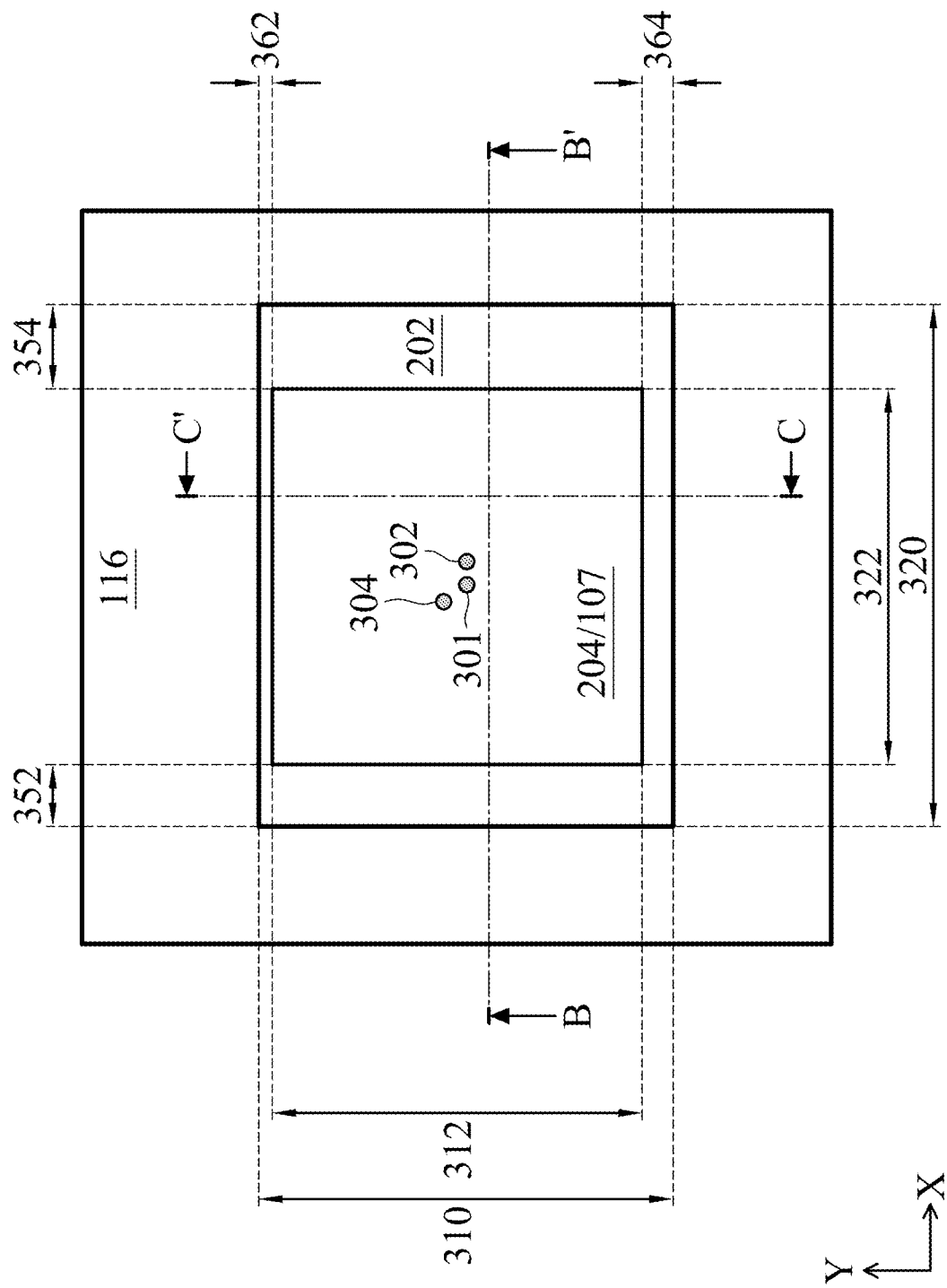
FIG. 3 shows a plan view of an inverted trapezoidal heat dissipating solder structure according to an embodiment of the present disclosure.

As shown in FIG. 1E, heat energy 420 and/or pressure is applied to the first and second flux material layers 106A and 106B and the soldering material layer 114. In some embodiments, as discussed, the first and second flux material layers 106A and 106B facilitate bonding the soldering material layer 114 to the lid 116. In some embodiments, as shown in FIGS. 1E, 1F, and 3, a layer of metal plating 202, e.g., gold or silver plating that provide good heat conductance, is disposed on the surface of the lid 116 that is in contact with the second flux material layer 106B. In some embodiments, the metal plating layer 202 includes one or more of AuIn2, AuIn and InNiAu. In some embodiments, the second flux material layer 106B improves wettability of the soldering material on the layer of metal plating 202 of the lid 116 to improve boding of the soldering material layer 114 with the layer of metal plating 202. In addition, the first flux material layer 106A improves wettability of the soldering material on the top surface 204 of the chip 104 to improve the boding of the soldering material layer 114 with the top surface 204 of chip 104 and to improve heat conduction property between the chip 104 and the soldering material layer 114. In some embodiments, the soldering material layer 114 comprises TIM. In some embodiments the first flux material layer 106A is formed on the metal layer 107 instead, and/or the second flux material layer 106B is formed on the plating layer 202.

In some embodiments, applying heat and/or pressure 410 causes the soldering material layer 114 to expand on the surface of the metal plating 202 shown in FIG. 3 and get the shape of the metal plating 202 of the lid 116. In some embodiments, the soldering material layer 114 does not expand on the surface of the lid beyond the area of the metal plating 202. In some embodiments, the size (area) of the metal plating 202 is larger than the size (are) of the top surface 204 of the chip 104. Thus, by applying the heat and/or pressure 410, the soldering material layer 114 acquires the shape of a trapezoid, e.g., an inverted trapezoid, with the larger base (area) of the trapezoid bonded with the metal plating 202 of the lid 116 and the smaller base (area) of the trapezoid bonded with metal layer 107 that is deposited over the chip 104. FIG. 1F shows the outcome of applying heat and/or pressure 410 in FIG. 1E that produces the inverted trapezoidal heat dissipating solder structure 102. As shown, by using the metal plating 202 on surface of the lid 116 that is in contact with the second flux material layer 106B, and by exerting heat energy 420 and/or pressure, the soldering material layer 114, e.g., a TIM layer, takes the form of an inverted trapezoid. As shown in FIG. 1F, solder bumps 118 are connected to a bottom surface of the chip 104. The solder bumps 118 provide electrical connection between the chip 104 and the circuit board (not shown) where the chip 104 is mounted. Power and ground are connected to the chip 104 via the solder bumps 118. In addition, control signals and data signals are communicated with the chip 104 via the solder bumps 118. As shown in FIG. 1F, the first flux material layer 106A and the second flux material layer 106B are effectively evaporated.

In some embodiments, an area for metal plating on the lid 117 is designated. In some embodiments, the area of the metal plating 202 of the lid 116 is enlarged, e.g., the metal plating 202 with a larger area is disposed on the lid 116. As noted, the increase in the area of the metal plating 202 causes an increase in the area of the larger base of the inverted trapezoid. The increase in the area of the larger base of the inverted trapezoid may increase the heat dissipation between the chip 104 and the lid 116. In some embodiments, by exerting heat energy 420 and/or pressure to the lid 116, the soldering material layer 114 melts. As discussed, applying the second flux material layer 106B increases the wettability of soldering material and, thus, the melted soldering material flows and spreads over the metal plating 202 and takes the shape (area) of the metal plating 202 in the larger base of the inverted trapezoidal shape. Therefore, by setting the area of the metal plating 202 larger than the area of the upper surface of the chip an amount of heat dissipation from the semiconductor chip to the lid 116 can be increased. In some embodiments, top side of the flowing melted soldering material is limited by the metal plating 202 and is limited to the size of the metal plating 202. Thus, the area of the larger base of the inverted trapezoidal shape is proportionally controlled by the area size of the metal plating 202. In some embodiments, because of the functionality of the chip 104, more heat is produced in the chip 104 and, thus, more heat dissipation is needed for the chip 104. The lid 116 of the inverted trapezoidal heat dissipating solder structure 102 is replaced with another lid having a metal plating with a larger area than the area of the metal plating of an existing inverted trapezoidal heat dissipating solder structure 102. The larger area of the metal plating produces a larger base for the inverted trapezoidal shape of the soldering material layer 114 that in turn increases the heat dissipation from the chip 104 to the lid 116.

Figure 2A:
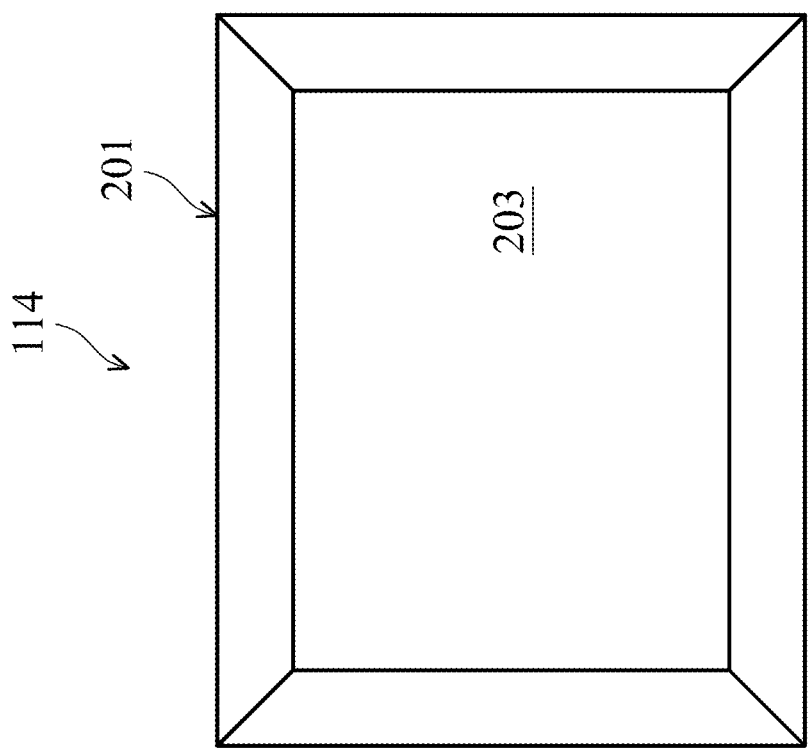
FIGS. 2A, 2B, 2C and 2D show views of an inverted trapezoid used in an inverted trapezoidal heat dissipating solder structure according to an embodiment of the present disclosure.
Figure 2A:
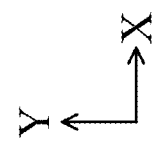
Figure 2B:
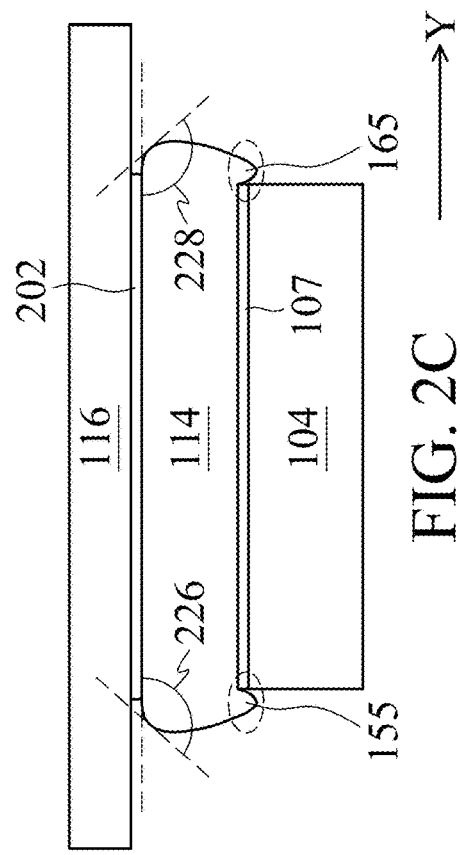
Figure 2C:
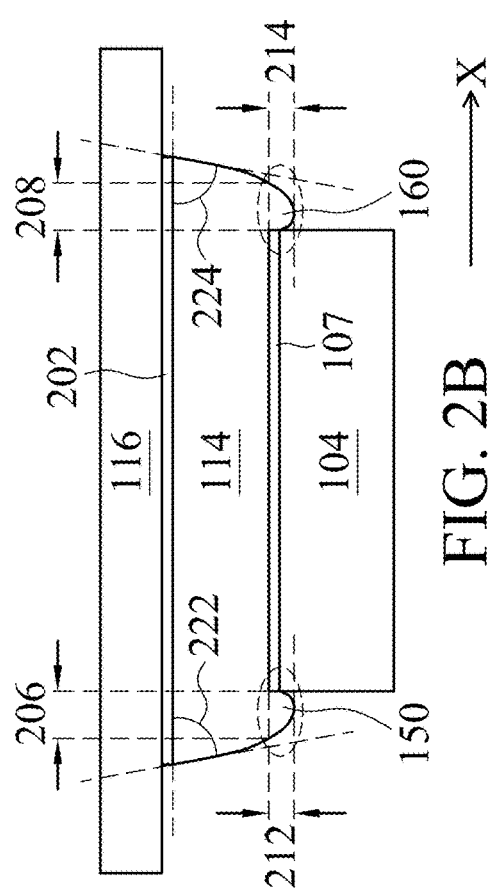

FIGS. 2A, 2B, and 2C show views of an inverted trapezoidal shape used in an inverted trapezoidal heat dissipating solder structure according to an embodiment of the present disclosure. FIG. 2A shows the soldering material layer (TIM layer) 114 that has the shape of an inverted trapezoid. The inverted trapezoid has a first base 201 that is larger than a second base 203. The first base 201 is in contact with the lid 116 through the second flux material layer 106B and the second flux material layer 106B facilitates a bonding between the first base 201 and the metal plating 202 of the lid 116 that improves heat conductance between the soldering material layer 114 and the lid 116. In addition, the second base 203 is in contact with the chip through the first flux material layer 106A and the first flux material layer 106A facilitates a bonding between the second base 203 and the top surface 204 of the chip 104 that improves heat conductance between the soldering material layer 114 and the chip 104. As shown, the first base 201, which is the larger base of the trapezoid is bonded with the lid 116 where the lid is connected to a heat sink and/or fan. Thus, the larger the area of the first base 201 the greater an amount of heat dissipation between the chip 104 and the lid 116. In some embodiments, the first base 201 has the same shape and size of the metal plating 202 of the lid 116 and the second base 203 has the same shape and size of the top surface 204 of the chip 104.

FIG. 2B shows a cross section view through the section B-B' of FIG. 3. As shown, the sides of the inverted trapezoid has angles 222 and 224 with the horizontal X-direction, which is along a length of the metal plating 202. In some embodiments, the angles 222 and 224 are between about 50 degrees and 88 degrees. Also, as shown, in the X-direction, the first base 201 extends beyond the second base 203, e.g., extends beyond the top surface 204 of the chip 104. As noted above, exerting the heat energy 420 and/or pressure to the lid 116 causes the soldering material layer 114 to extend beyond the top surface 204 of the chip 104 to the limits of the metal plating 202. In addition, the chip 104 is pushed into the soldering material layer 114 and overhanging structures 150 and 160 are produced at both sides of the top surface 204 of the chip 104. As shown, the overhanging structures 150 and 160 have respective lengths 206 and 208 in the X-direction and have respective thicknesses 212 and 214 in a direction perpendicular to the top surface 204 of the chip 104. In some embodiments, the lengths 206 and 208 are between about 10 microns and 4500 microns. Also, the thicknesses 212 and 214 are between about 5 microns and 650 microns.

Figure 2D:
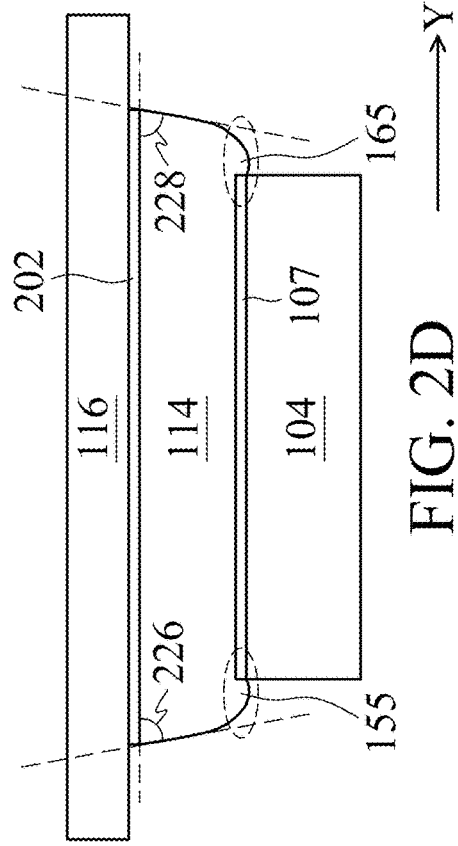

FIGS. 2C and 2D show a cross sectional views through the section C-C' of FIG. 3. As shown, the sides of the inverted trapezoid have angles 226 and 228 with the vertical Y-direction, which is along a width of the metal plating 202. In some embodiments, as shown in FIG. 2C, in the Y-direction, the first base 201 although extends beyond the second base 203, the extension is smaller than the extension in the X-direction. Therefore, exerting the heat energy 420 and/or pressure to the lid 116 causes the soldering material layer 114 to bulge and produce an obtuse angle with the surface of the metal plating 202. In some embodiments, as shown in FIG. 2D, the first base 201 extends beyond the top surface 204 of the chip 104 similar to FIG. 2B and the soldering material layer 114 produces an acute angle with the surface of the metal plating 202. Therefore, in some embodiments, the angles 226 and 228 are between about 55 degrees and 165 degrees. In some embodiments, as shown in FIGS. 2C and 2D, the overhanging structures 155 and 165 extend in the Y-direction beyond top surface 204 of the chip 104.

FIG. 3 shows a plan view of an inverted trapezoidal heat dissipating solder structure according to an embodiment of the present disclosure. FIG. 3 shows the lid 116, the metal plating 202 that is disposed, e.g., deposited, on the lid 116, and the top surface 204 of the chip 104. As shown, the top surface 204 of the chip 104 has a smaller area than the area of the metal plating 202 on the lid 116 and is contained inside the metal plating 202. In some embodiments, the metal plating 202 of the lid 116 has a first length 320 that is larger than a length 322 of the top surface 204 of the chip 104 and has a width 310 that is larger than a width 312 of the top surface 204 of the chip 104. In some embodiments, the length and the width of the metal plating 202 extend beyond the top surface 204 of the chip 104 between about 5 percent to 10 percent of the respective length or width of the top surface 204. In some embodiments, the top surface 204 of the chip 104 has an area between about 25 millimeter squared and 2500 millimeter squared, the metal plating 202 has an area between about 26 millimeter squared and 3025 millimeter squared, and the lid 116 has an area between about 100 millimeter squared and 10,000 millimeter squared. In some embodiments, the metal plating 202 and the top surface of the chip 104 are rectangular and geometrically similar to each other. In some embodiments, as shown the metal layer 107 is disposed over the top surface 204 of the chip 104. In some embodiments, the first length extends over the top surface 204 of the semiconductor chip 104 from each end of the second length between 10 percent to 100 percent of the length of the top surface 204 and the first width extends over the top surface 204 of the semiconductor chip 104 from each end of the second width between 10 percent to 100 percent of the width of the top surface 204.

In some embodiments, in the plan view, the top surface 204 of the chip 104 is centered inside the metal plating 202 and in some other embodiments, a center 302 of the top surface 204 of the chip 104 does not coincide with a center 304 of the lid 116. In some embodiments, during the packaging process, a center 301 of the first base 201 of the inverted trapezoid e.g., the center of the metal plating 202, does not coincide with the center 304 of the lid 116 or does not coincide with a center 302 of the top surface 204 of the chip 104. In some embodiments, an offset between the centers 304 and 301 is between about 10 microns and 35 microns in either X-direction and/or Y-directions. In some embodiments, an offset between the centers 302 and 301 is between about 10 microns and 2000 microns in either X-direction and/or Y-directions.

As shown in FIG. 3, distances 352 and 354 exist between the top surface 204 of the chip 104 with the metal plating 202 in the X-direction and distances 362 and 364 exist between the top surface 204 of the chip 104 with the metal plating 202 in the Y-direction. In some embodiments, the distances 352 and 354 are few times, e.g., twice or more, larger than the distances 362 and 364. Thus, in some embodiments, in the X-direction, the soldering material layer 114 extends gradually from edges of the top surface 204 of the chip 104 to edges of the metal plating 202 and the soldering material layer 114 produce and acute angle, between about 30 degrees and 89 degrees with the surface of the metal plating 202. In some embodiments, in the Y-direction, the soldering material layer 114 does not have enough distance to extend gradually from edges of the top surface 204 of the chip 104 to edges of the metal plating 202 and a bulge is produced the soldering material layer 114 that produces and obtuse angle between about 150 degrees and 179 degrees is produces with the surface of the metal plating 202. In some embodiments, in the Y-direction, however, the soldering material layer 114 has enough distance to extend gradually from edges of the top surface 204 of the chip 104 to edges of the metal plating 202 and an acute angle between 45 degrees and 89 degrees is created between the soldering material layer 114 and the surface of the metal plating 202.

Figure 4I:
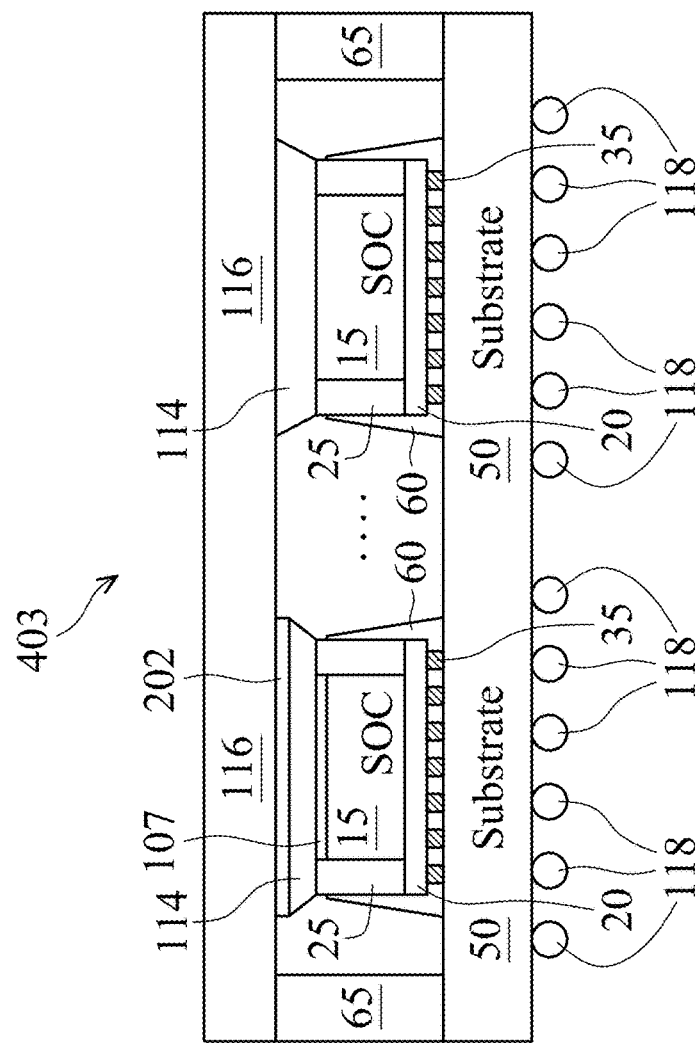

FIGS. 4A, 4B, 4C, 4D, 4E, 4F, 4G, 4H, and 4I show a process of making two or more inverted trapezoidal heat dissipating solder structures according to an embodiment of the present disclosure. FIG. 4A shows a chip, e.g., an SOC 15. The SOC 15 is mounted on a redistribution layer, e.g., an interface 20, which is connected via solder bumps 35 to a substrate 50, e.g., a semiconductor substrate. The SOC 15 is embedded in a molding 25. In some embodiments, an underfill material 60 is formed between the SOC 15 and the substrate 50, as shown in FIG. 4A. In addition, a lid base structure 65 is disposed at both sides of the SOC 15. FIG. 4B shows two or more SOCs 15, similar to the SOC of FIG. 4A, that are mounted side by side on the substrate 50. In the FIGS. 4C, 4D, 4E, 4F, 4G, and 4H, the same processes are applied to both SOCs 15 of FIG. 4B, however, the figures only show one SOC for brevity. In FIG. 4C, the flux material 112 is dispensed, by the dispensing device 110, over the top surface 204 of the SOC 15 to produce a first flux material layer 106A that is disposed over the SOC 15. FIG. 4D shows that a soldering material layer 114 is disposed over the first flux material layer 106A. FIG. 4E shows the dispensing device 110 that is dispensing the flux material 112 over the soldering material layer 114 to produce a second flux material layer 106B. FIG. 4F shows that a lid 116 disposed over the second flux material layer 106B. The lid 116 is placed on the lid base structure 65 and is in contact with the second flux material layer 106B in some embodiments. In other embodiments, a small gap exists between the lid base structure 65 and the lid 116. As shown in FIG. 4G, the heat/pressure application device 415 is placed over the lid 116 and heat and/or pressure 410 is applied through the heat/pressure application device 415 to the lid 116.

As shown in FIG. 4G, heat energy 420 is applied to the first and second flux material layers 106B and the soldering material layer 114. As discussed, the application of heat energy 420 and/or pressure causes the soldering material layer 114 to bond with the metal plating 202 of the lid 116. In addition, the metal layer 107 of titanium, gold, or nickel is deposited, e.g., sputtered, on the top surface 204 of the SOC 15 that is in contact with the first flux material layer 106A. In some embodiments, the second flux material layer 106B cleans and removes impurities and oxides from the surface of the metal plating 202 and facilitates bonding of the soldering material layer 114 with the lid 116. In addition, the first flux material layer 106A cleans and removes impurities and oxides from the surface of the metal layer 107 and facilitates bonding of the soldering material layer 114 with the top surface 204 of the SOC 15. Thus, using the first and second flux material layers 106A and 106B improves the heat conduction property between the SOC 15 and the soldering material layer 114 and between the lid 116 and the soldering material layer 114. In some embodiments, at least a portion of the metal plating 202 of the lid 116 and the metal layer 107 over the top surface 204 of the chip diffuse into the soldering material layer 114. As shown in FIG. 4G, the first flux material layer 106A and the second flux material layer 106B are effectively evaporated.

In some embodiments, applying heat and/or pressure 410 causes the soldering material layer 114 to expand and get the shape of the metal plating 202 of the lid 116. In some embodiments, the size of the metal plating 202 is larger than the size of the top surface 204 of the chip 104. Thus, by applying the heat and/or pressure 410, the soldering material layer 114 acquires the shape of a trapezoid, e.g., an inverted trapezoid, with the larger base of the trapezoid bonded with the metal plating 202 of the lid 116 and the smaller base of the trapezoid bonded with metal layer that is deposited over the SOC 15.

Figure 4H:
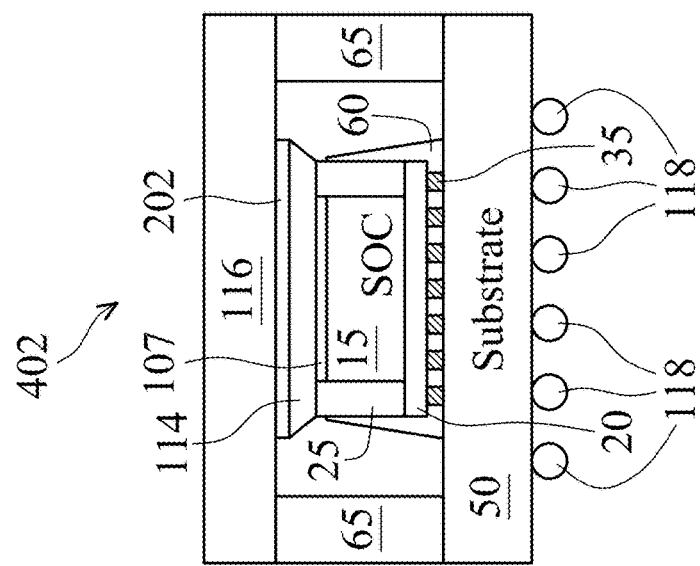

FIG. 4H shows the outcome of applying heat and/or pressure 410 in FIG. 4G that produces the inverted trapezoidal heat dissipating solder structure 402. As shown, by using the metal plating 202 on surface of the lid 116 that is in contact with the second flux material layer 106B, and by exerting heat energy 420 and/or pressure, the soldering material layer 114, e.g., a TIM layer, take the form of an inverted trapezoid. As shown in FIG. 4H, solder bumps 118 are connected to a bottom surface of the substrate 50. The solder bumps 118 provide electrical connection between the substrate 50 and the rest of the circuitry (not shown). Power and ground are connected to the SOC 15 via the solder bumps 118. In addition, control signals and data signals are communicated with the SOC 15 via the solder bumps 118. FIG. 4I shows an inverted trapezoidal heat dissipating solder structure 403 that includes two or more SOCs 15, similar to the SOC of FIG. 4H, that are mounted side by side on the substrate 50. As shown in FIG. 4I, for one SOCs 15, the metal plating 202 of the lid 116 and the metal layer 107 over the top surface 204 of the chip are effectively diffused into the soldering material layer 114.

Figure 5:
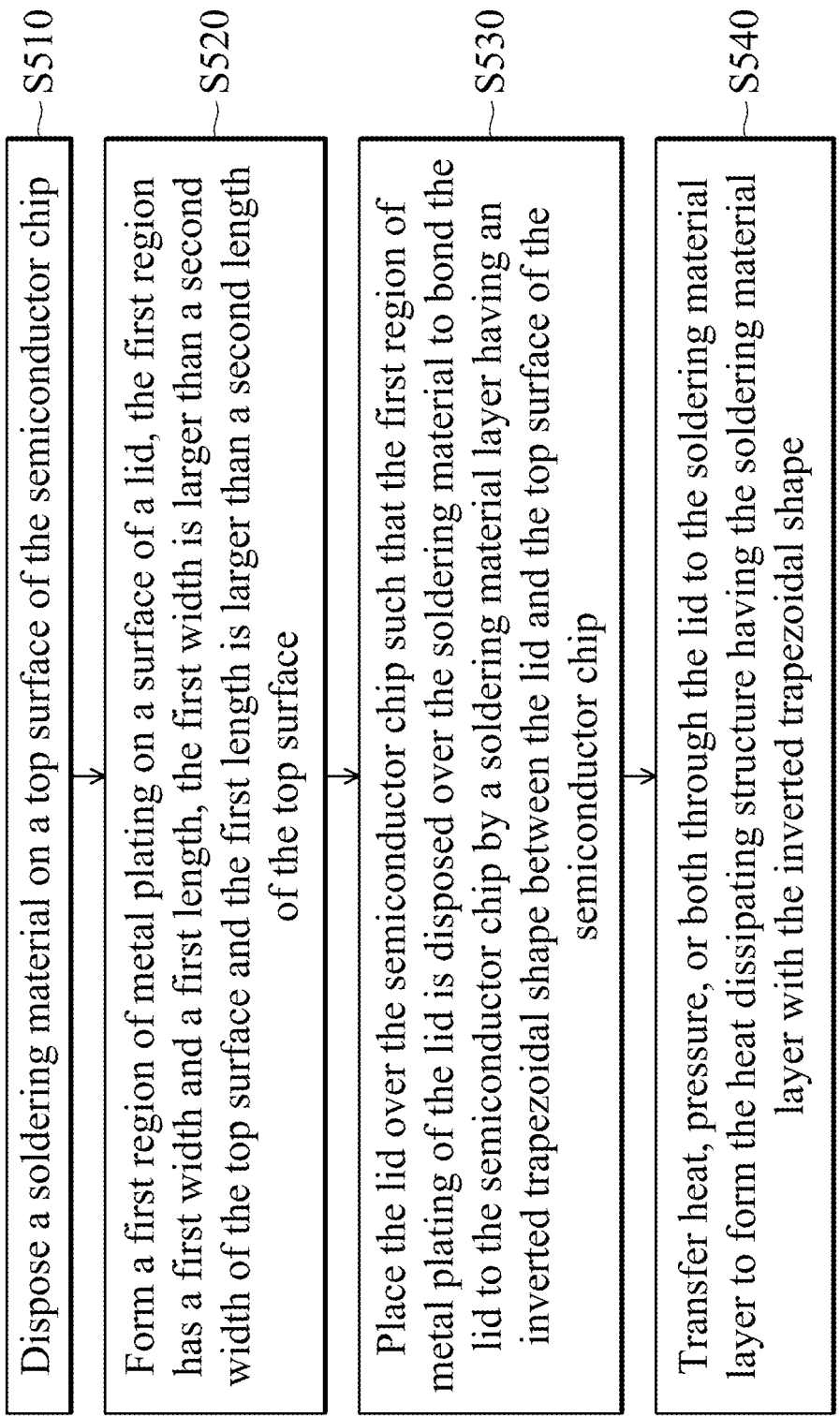
FIG. 5 shows a flow diagram of a process for generating an inverted trapezoidal heat dissipating solder structure according to an embodiment of the present disclosure.

FIG. 5 shows a flow diagram of a process 500 for generating an inverted trapezoidal heat dissipating solder structure according to an embodiment of the present disclosure. In some embodiments, as shown in FIGS. 1A and 1C, a soldering material is disposed on a top surface of the semiconductor chip 104 in operation S510. In operation S520, as shown in FIG. 3, a first region of metal plating 202 is formed on a surface of a lid 116. The first region 202 has a first length 320 and a first width 310, the first length 320 is larger than a second length 322 of the top surface 204 of the chip and the first width 310 is larger than a second width 312 of the top surface 204. In operation S530, as shown in FIG. 3, the lid is placed over the semiconductor chip such that the first region of metal plating 202 of the lid 116 is disposed over the soldering material to bond the lid 116 to the semiconductor chip 104 by a soldering material layer 114 having an inverted trapezoidal shape between the lid 116 and the top surface of the semiconductor chip 104. In operation S540, as shown in FIG. 4G, heat, pressure, or both is transferred through the lid 116 to the soldering material layer 114 to form the heat dissipating structure having the soldering material layer with the inverted trapezoidal shape.

According to some embodiments of the present disclosure, a method of forming a heat dissipating structure for a semiconductor chip includes disposing a soldering material on a top surface of the semiconductor chip and forming a first region of metal plating on a surface of a lid. The first region has a first width and a first length, and the first width is larger than a second width of the top surface and the first length is larger than a second length of the top surface. The method also includes placing the lid over the semiconductor chip so that the first region of metal plating of the lid is disposed over the soldering material to bond the lid to the semiconductor chip by a soldering material layer having an inverted trapezoidal shape between the lid and the top surface of the semiconductor chip. In an embodiment, the method further includes transferring heat, pressure, or both through the lid to the soldering material layer to form the heat dissipating structure having the soldering material layer with the inverted trapezoidal shape. In an embodiment, a larger base of the inverted trapezoidal shape is closer to the lid and has a first area that is essentially a same as an area of the first region. A smaller base of the inverted trapezoidal shape is closer to the top surface of the semiconductor chip and has a second area that is essentially a same as an area of the top surface of the semiconductor chip. In an embodiment, the method further includes extending the first length over the top surface of the semiconductor chip from both ends of the second length and extending the first width over the top surface of the semiconductor chip from both ends of the second width. In an embodiment, the method further includes that prior to the disposing the soldering material, disposing a first layer of a flux material over the top surface of the semiconductor chip. The first layer of the flux material is formed between the soldering material layer and the top surface of the semiconductor chip to clean the top surface of the semiconductor chip and to facilitate a bonding of the soldering material layer to the top surface of the semiconductor chip. In an embodiment, the method further includes that after the disposing the soldering material and before the placing the lid, disposing a second layer of the flux material over the soldering material. The second layer of the flux material is formed between the soldering material layer and the lid to clean the first region of the lid and to facilitate bonding of the soldering material layer to the first region of the lid. In an embodiment, the metal plating includes gold or silver, the flux material includes an organic material, and the method further includes prior to disposing the first layer of the flux material over the top surface of the semiconductor chip, sputtering gold, titanium, nickel, or a combination thereof, on the top surface of the semiconductor chip. In an embodiment, the method further includes increasing an area of the first region of metal plating to increase the larger base of the inverted trapezoidal shape to cause an increase in an amount of heat dissipation from the semiconductor chip.

According to some embodiments of the present disclosure, a method of forming a heat dissipating structure includes disposing a thermal interface material (TIM) on a top surface of two or more semiconductor chips and forming two or more first regions of metal plating on a surface of a lid. Each first region has a first width larger than a second width of a respective top surface of a semiconductor chip, and each first region has a first length larger than a second length of the respective top surface of the semiconductor chip. The method also includes placing the first regions of metal plating of the lid over the TIM of each respective semiconductor chip to form a TIM layer having an inverted trapezoidal shape between the lid and the top surface of each respective semiconductor chip. The method further includes transferring heat, pressure, or a combination thereof through the lid to the TIM layer of the respective semiconductor chip to form the heat dissipating structure having the TIM layer with the inverted trapezoidal shape for each semiconductor chip. In an embodiment, a larger base of each inverted trapezoidal shape of the respective semiconductor chip is closer to the lid and has a first area that is essentially a same as an area of the respective first region of semiconductor chip. A smaller base of each inverted trapezoidal shape is closer to the top surface of the semiconductor chip and has a second area that is essentially a same as an area of the top surface of the semiconductor chip. In an embodiment, at least one semiconductor chip is a system on chip (SOC) and the method further includes disposing the SOC on a semiconductor substrate and receiving control and power connections, by the SOC via two or more solder bumps, from the semiconductor substrate. In an embodiment, the SOC is disposed over an interface layer and the interface layer is connected to a semiconductor substrate via the two or more solder bumps. In an embodiment, the method further include for each semiconductor chip, prior to the disposing the TIM material, disposing a first layer of a flux material over the top surface of the respective semiconductor chip. The first layer of the flux material is formed between the TIM layer and the top surface of the semiconductor chip to facilitate a bonding of the TIM layer to the top surface of the semiconductor chip, and for each semiconductor chip, after the disposing the TIM material and before the placing the lid, disposing a second layer of the flux material over the TIM material. The second layer of the flux material is formed between the TIM layer and the lid to facilitate a bonding of the TIM layer to a corresponding first region of the lid. In an embodiment, the metal plating include gold or silver. The flux material includes an organic material, and the method further includes that prior to disposing the first layer of the flux material over the top surface of the respective semiconductor chip, sputtering gold, titanium, or nickel on the top surface of the semiconductor chip.

According to some embodiments of the present disclosure, a heat dissipating structure includes a soldering material layer disposed on a top surface of a semiconductor chip and a lid that includes a first region of metal plating disposed over the soldering material layer. The first region has a first width and a first length, and the first width is larger than a second width of the top surface and the first length is larger than a second length of the top surface. The soldering material layer has an inverted trapezoidal shape between the lid and the top surface of the semiconductor chip. In an embodiment, a larger base of the inverted trapezoidal shape is closer to the lid and has a first area that is essentially a same as an area of the first region, and a smaller base of the inverted trapezoidal shape is closer to the top surface of the semiconductor chip and has a second area that is essentially a same as an area of the top surface of the semiconductor chip. In an embodiment, the heat dissipating structure further includes that a first layer of a flux material is disposed over the top surface of the semiconductor chip, and a second layer of the flux material is disposed over the soldering material. The first layer of the flux material is formed between the soldering material layer and the top surface of the semiconductor chip, and the second layer of the flux material is formed between the soldering material layer and the lid. In an embodiment, the metal plating includes gold or silver, the flux material includes an organic material, and a layer of gold, titanium, or nickel is disposed on the top surface of the semiconductor chip. In an embodiment, the first length extends over the top surface of the semiconductor chip from each end of the second length between 10 percent to 50 percent of the length of the top surface, and the first width extends over the top surface of the semiconductor chip from each end of the second width between 10 percent to 50 percent of the width of the top surface. In an embodiment, sides of the inverted trapezoidal shape at both ends of the second length has an angle between 50 degrees and 85 degrees with the lid, and sides of the inverted trapezoidal shape at both ends of the second width has an angle between 55 degrees and 165 degrees with the lid.

It will be understood that not all advantages have been necessarily discussed herein, no particular advantage is required for all embodiments or examples, and other embodiments or examples may offer different advantages.

As explained, generating an inverted trapezoidal shape for the TIM layer which has a lager base in contact with the lid causes better heat transfer between the top surface of the chip and the lid as compared to a TIM layer having a rectangular shape.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a heat dissipating structure for a semiconductor chip, comprising:
    sputtering gold, titanium, nickel, or a combination thereof, on a top surface of the semiconductor chip;
    disposing a first layer of a flux material over a top surface of a semiconductor chip, the flux material comprising an organic material;
    disposing a soldering material on the semiconductor chip so that the first layer of flux material is formed between the soldering material and the top surface of the semiconductor chip to clean the top surface of the semiconductor chip and to facilitate a bonding of the soldering material to the top surface of the semiconductor chip;
    forming a first region of metal plating comprising gold or silver on a surface of a lid, the first region having an area smaller than an area of the lid, wherein the first region has a first width and a first length, and wherein the first width is larger than a second width of the top surface and the first length is larger than a second length of the top surface;
    disposing a second layer of the flux material over the soldering material; and
    placing the lid over the semiconductor chip so that the first region of metal plating of the lid is disposed over the soldering material to bond the lid to the semiconductor chip by a soldering material layer having an inverted trapezoidal shape between the lid and the top surface of the semiconductor chip,
    wherein the second layer of the flux material is formed between the soldering material and the lid to clean the first region of the lid and to facilitate bonding of the soldering material layer to the first region of the lid.

2. The method of claim 1, further comprising:
    transferring heat, pressure, or both through the lid to the soldering material layer to form the heat dissipating structure having the soldering material layer with the inverted trapezoidal shape.

3. The method of claim 1, wherein:
    a larger base of the inverted trapezoidal shape is closer to the lid and has a first area that is essentially a same as an area of the first region, and
    a smaller base of the inverted trapezoidal shape is closer to the top surface of the semiconductor chip and has a second area that is essentially a same as an area of the top surface of the semiconductor chip.

4. The method of claim 3, further comprising:
    extending the first length over the top surface of the semiconductor chip from both ends of the second length; and
    extending the first width over the top surface of the semiconductor chip from both ends of the second width.

5. The method of claim 3, further comprising:
    increasing an area of the first region of metal plating to increase the larger base of the inverted trapezoidal shape to cause an increase in an amount of heat dissipation from the semiconductor chip.

6. The method of claim 1, wherein the flux material comprises citric acid, lactic acid or stearic acid.

7. The method of claim 1, wherein the flux material is a liquid or paste.

8. The method of claim 1, wherein the soldering material comprises indium (In), an alloy of indium (In) with silver (Ag) and/or copper (Cu), or a tin-containing alloy.

9. The method of claim 4, wherein the first length extends over the top surface of the semiconductor chip from both ends of the second length between 10 percent to 50 percent of the length of the top surface, and the first width extends over the top surface of the semiconductor chip from both ends of the second width between 10 percent to 50 percent of the width of the top surface.

10. The method of claim 4, wherein sides of the inverted trapezoidal shape at both ends of the second length have an angle between 50 degrees and 85 degrees with the lid, and sides of the inverted trapezoidal shape at both ends of the second width have an angle between 55 degrees and 165 degrees with the lid.

11. A method of forming a heat dissipating structure, comprising:
    sputtering gold, titanium, or nickel on a top surface of two or more semiconductor chips;
    disposing a first layer of a flux material comprising an organic material over the top surfaces of the two or more semiconductor chips;
    disposing a thermal interface material (TIM) layer on the top surface of the two or more semiconductor chips so that the first layer of the flux material is formed between the TIM layer and the top surfaces of the semiconductor chips to facilitate a bonding of the TIM layer to the top surfaces of the semiconductor chips;
    disposing a second layer of the flux material over the TIM layer, the second layer of the flux material formed between the TIM layer and a lid to facilitate bonding of the TIM layer to a corresponding region of the lid;
    forming two or more first regions of metal plating comprising gold or silver on a surface of the lid, the two or more first regions each having an area smaller than an area of the lid, wherein each first region has a first width larger than a second width of a respective top surface of a semiconductor chip, and wherein each first region has a first length larger than a second length of the respective top surface of the semiconductor chip;
    placing the first regions of metal plating of the lid over the TIM layer of each respective semiconductor chip to form a TIM layer having an inverted trapezoidal shape between the lid and the top surface of each respective semiconductor chip; and transferring heat, pressure, or a combination thereof through the lid to the TIM layer of the respective semiconductor chip to form the heat dissipating structure having the TIM layer with the inverted trapezoidal shape for each semiconductor chip.

12. The method of claim 11, wherein:

a larger base of each inverted trapezoidal shape of the respective semiconductor chip is closer to the lid and has a first area that is essentially a same as an area of the respective first region of semiconductor chip, and a smaller base of each inverted trapezoidal shape is closer to the top surface of the semiconductor chip and has a second area that is essentially a same as an area of the top surface of the semiconductor chip.

13. The method of claim 11, wherein:

at least one semiconductor chip is a system on chip (SOC), and the method further comprises:
disposing the SOC on a semiconductor substrate; and
receiving control and power connections, by the SOC via two or more solder bumps, from the semiconductor substrate.

14. The method of claim 13, wherein the SOC is disposed over an interface layer and the interface layer is connected to a semiconductor substrate via the two or more solder bumps.

15. A heat dissipating structure, comprising:

a layer of gold, titanium, or nickel disposed on a top surface of a semiconductor chip;

a first layer of flux material disposed on the top surface of the semiconductor chip, the flux material comprising an organic material;

a soldering material layer disposed on a top surface of a semiconductor chip so that the first layer of flux material is between the soldering material layer and the top surface of the semiconductor chip;

a second layer of flux material disposed over the soldering material layer;

a lid comprising a first region of metal plating comprising gold or silver disposed over the soldering material layer so that the second layer of flux material is formed between the soldering material layer and the lid, wherein:

the first region has a first width and a first length and an area smaller than an area of the lid, the first width is larger than a second width of the top surface and the first length is larger than a second length of the top surface, and the soldering material layer has an inverted trapezoidal shape between the lid and the top surface of the semiconductor chip.

16. The heat dissipating structure of claim 15, wherein:

a larger base of the inverted trapezoidal shape is closer to the lid and has a first area that is essentially a same as an area of the first region, and a smaller base of the inverted trapezoidal shape is closer to the top surface of the semiconductor chip and has a second area that is essentially a same as an area of the top surface of the semiconductor chip.

17. The heat dissipating structure of claim 15, wherein:

the first length extends over the top surface of the semiconductor chip from both ends of the second length between 10 percent to 50 percent of the length of the top surface, and the first width extends over the top surface of the semiconductor chip from both ends of the second width between 10 percent to 50 percent of the width of the top surface.

18. The heat dissipating structure of claim 15, wherein:

sides of the inverted trapezoidal shape at both ends of the second length have an angle between 50 degrees and 85 degrees with the lid, and sides of the inverted trapezoidal shape at both ends of the second width have an angle between 55 degrees and 165 degrees with the lid.

19. The heat dissipating structure of claim 15, wherein the flux material comprises citric acid, lactic acid or stearic acid.

20. The heat dissipating structure of claim 15, wherein the soldering material comprises indium (In), an alloy of indium (In) with silver (Ag) and/or copper (Cu), or a tin-containing alloy.

* * * * *